(12) United States Patent
Arai et al.

(10) Patent No.: US 6,842,886 B2
(45) Date of Patent: Jan. 11, 2005

(54) BASIC CELL OF GATE ARRAY SEMICONDUCTOR DEVICE, GATE ARRAY SEMICONDUCTOR DEVICE, AND LAYOUT METHOD FOR GATE ARRAY SEMICONDUCTOR DEVICE

(75) Inventors: Kenji Arai, Tokyo (JP); Hidekazu Kikuchi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 59 days.

(21) Appl. No.: 10/305,246

(22) Filed: Nov. 27, 2002

(65) Prior Publication Data

US 2003/0226128 A1 Dec. 4, 2003

(30) Foreign Application Priority Data

May 31, 2002 (JP) ........................... 2002-159933

(51) Int. Cl.7 ............................................. G06F 17/50
(52) U.S. Cl. .................... 716/10; 716/8; 716/11
(58) Field of Search ..................... 716/8–11; 257/401

(56) References Cited

U.S. PATENT DOCUMENTS

| | | | |
|---|---|---|---|
| 5,367,187 A | * 11/1994 | Yuen | ........................ 257/401 |
| 5,384,472 A | 1/1995 | Yin | |
| 5,436,485 A | * 7/1995 | Shikatani et al. | ............ 257/368 |
| 5,565,758 A | 10/1996 | Yoeli et al. | |
| 5,663,662 A | 9/1997 | Kurosawa | |
| 6,204,542 B1 | * 3/2001 | Kinoshita et al. | ........... 257/401 |
| 2002/0034110 A1 | * 3/2002 | Furuya et al. | .............. 365/201 |

FOREIGN PATENT DOCUMENTS

| | | |
|---|---|---|
| JP | 58-066343 | 4/1983 |
| JP | 04-164371 | 6/1992 |
| JP | 07-130972 | 5/1995 |
| JP | 07-202144 | 8/1995 |
| JP | 07-307447 | 11/1995 |
| JP | 08023082 A | 1/1996 |
| JP | 08-181216 | 7/1996 |
| JP | 08-213574 | 8/1996 |
| JP | 10335612 A | 12/1998 |
| JP | 2001-036050 | 2/2001 |
| JP | 2001-338989 | 12/2001 |

* cited by examiner

*Primary Examiner*—Vuthe Siek
(74) *Attorney, Agent, or Firm*—Volentine Francos & Whitt, PLLC

(57) ABSTRACT

A basic cell of a gate array semiconductor device, including first and second p-channel MOS transistors and first and second n-channel MOS transistors, wherein the first p-channel MOS transistor and the first n-channel MOS transistor are disposed so as to share or divide a first gate, the second p-channel MOS transistor and the second n-channel MOS transistor are disposed to share or divide a second gate, and the first and second gates have portions bent at about 45 degrees with respect to a lengthwise direction.

30 Claims, 14 Drawing Sheets

NO. OF PASSABLE GRIDS: 2

NO. OF PASSABLE GRIDS: 3

BASIC CELL OF GATE ARRAY SEMICONDUCTOR DEVICE, GATE ARRAY SEMICONDUCTOR DEVICE, AND LAYOUT METHOD FOR GATE ARRAY SEMICONDUCTOR DEVICE

BACKGROUND OF THE INVENTION

1. Field of the Invention

The present invention relates to a structure of a basic cell of a gate array type semiconductor device (gate array semiconductor device) and an art characterized by a layout method thereof.

2. Description of the Related Art

With the improving technology for microminiaturizing an LSI (Large Scale Integration) circuits, the number of gates mounted per unit area, namely, "integration", is increasing as indicated by Moore's Law. However, as the microminiaturization reaches a submicron scale and further a nano-order scale, the layout of a basic cell inevitably finds some places that do not match a gate scaling because of an available wiring method and the electrical characteristics of a semiconductor circuit. Hence, there has been a problem in that higher integration that successfully matches a higher level of microminiaturization cannot be achieved unless sophisticated design of the structure of a basic cell for the layout is accomplished.

As a solution to the above problem, there is, for example, a technique disclosed in Japanese Unexamined Patent Publication No. 10-335612. According to the technique, a well drawing region is disposed at an outer corner of each gate cell and a power bus is also disposed on the outer side of the gate cell so as to allow the well drawing region and the power bus to be shared. This arrangement makes it possible to reduce the number of transistors in a single cell, which is repeated, from 8 to 4.

According to another technique disclosed in, for example, Japanese Unexamined Patent Publication No. 8-23082, a wiring route is simplified by omitting the wiring connected to the source/drain region of a transistor from a power source wire in a gate layout so as to attain a higher level of integration by restraining an increase in the wiring area. In this case, the source/drain region is laid out such that it projects at a gate-shaped top portion, thus obviating the need for the wiring from the power source wire. Thus, no wiring layers interfere with the wiring route of a logic circuit, so that the freedom of wiring is improved and the congestion problem of wires can be solved, resulting in higher integration.

These techniques, however, are intended for improving integration by devising an inventive layout structure so as to reduce the area required for wiring, and the sizes of the elements (basic cells) making up a gate array remain unchanged.

SUMMARY OF THE INVENTION

Accordingly, it is an object of the present invention to provide a novel, improved basic cell of a gate array semiconductor device that is capable of achieving a significantly increased number of mounted gates and an increased number of effectively usable gates, as compared with a conventional basic cell, by compressing the area of basic cells making up the gate array semiconductor device. It is another object of the present invention to provide a gate array semiconductor device and a layout method for a gate array semiconductor device.

According to one aspect of the present invention, there is provided a basic cell of a gate array semiconductor device. The basic cell of a gate array semiconductor in accordance with the present invention includes first and second p-channel MOS transistors and first and second n-channel MOS transistors, wherein the first p-channel MOS transistor and the first n-channel MOS transistor are disposed so as to share or divide a first gate, the second p-channel MOS transistor and the second n-channel MOS transistor are disposed so as to share or divide a second gate, and the first and second gates have portions bent at about 45 degrees with respect to a lengthwise direction.

According to a second aspect of the present invention, there is provided a gate array semiconductor device formed by disposing at least one or more basic cell of the gate array semiconductor device according to the first aspect of the invention. The gate array semiconductor device in accordance with the present invention is provided with a contact grounding region located at the upper end of a first gate and at the lower end of a second gate.

According to a third aspect of the present invention, there is provided a layout method for a gate array semiconductor device. According to the layout method for a gate array semiconductor device, the layouts of at least two or more basic cells of the gate array semiconductor device according to the first aspect are prepared in the form of libraries, and an optimum basic cell is selected from the library according to the configuration of a desired gate array semiconductor device, and laid out.

DESCRIPTION OF THE PREFERRED EMBODIMENTS

Figure 1:
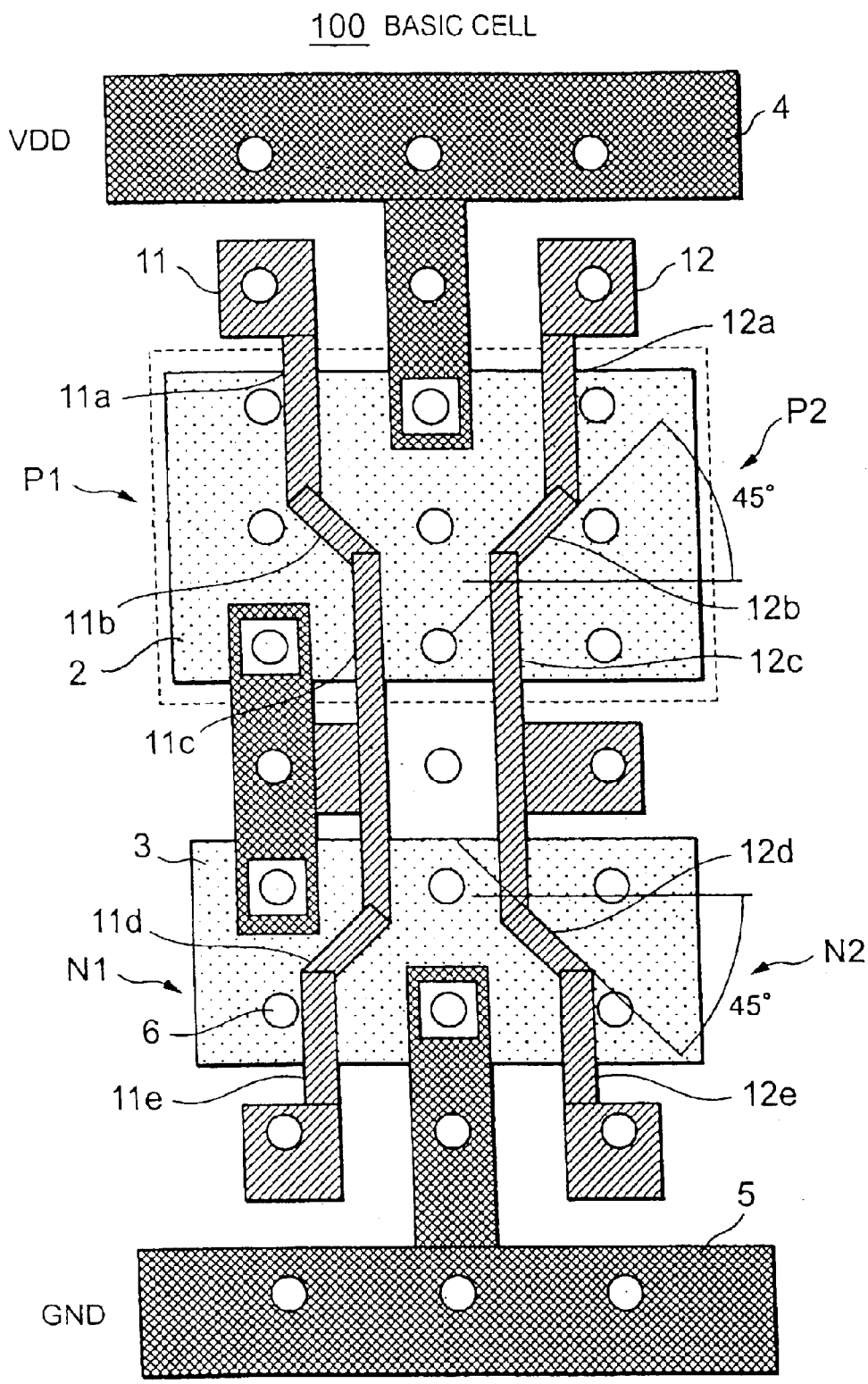
FIG. 1 is an explanatory drawing of a basic cell according to a first embodiment.

The preferred embodiments of a basic cell of a gate array semiconductor device, a gate array semiconductor device, and a layout method for a gate array semiconductor device in accordance with the present invention will now be described in detail with reference to the accompanying drawings. The constituent elements virtually having the same functional configurations in the specification and the drawings will be assigned the same reference numerals to avoid repetitious explanation.

(First Embodiment)

FIG. 1 is an explanatory drawing illustrating a basic cell of a gate array semiconductor device according to a first embodiment. As shown in FIG. 1, a basic cell 100 has first and second gates 11 and 12 formed of polysilicon that are disposed on a PMOS active area 2 and an NMOS active area 3. PMOS transistors P1 and P2 are formed in the portion of the PMOS active area 2, while NMOS transistors N1 and N2 are formed in the portion of the NMOS active area 3. In the drawing, the dashed line surrounding the PMOS active area 2 denotes a P implanted-layer forming P+ of the PMOS transistors P1 and P2.

The PMOS transistor P1 and the NMOS transistor N1 share the first gate 11, while the PMOS transistor P2 and the NMOS transistor N2 share the second gate 12. The first and second gates 11 and 12 are characterized in that they have portions bent at about 45 degrees with respect to a Y direction (lengthwise direction or vertical direction on the paper surface).

More specifically, in this embodiment, the first gate 11 is formed of a first linear portion 11a, a first bent portion 11b that is bent toward the second gate 12 at about 45 degrees, a second linear portion 11c, a second bent portion 11d that is bent away from the second gate 12 at about 45 degrees, and a third linear portion 11e located in this order from the top. The second gate 12 is formed of a first linear portion 12a, a first bent portion 12b that is bent toward the first gate 11 at about 45 degrees, a second linear portion 12c, a second bent portion 12d that is bent away from the first gate 11 at about 45 degrees, and a third linear portion 12e located in this order from the top.

In this embodiment, the layout of an inverter logic circuit is taken as an example. A power source wire 4 is connected to the PMOS active area 2 at the source end via a wire and a contact. Similarly, a GND wire 5 is connected to the NMOS active area 3 at the source end via a wire and a contact. The drain regions of the PMOS active area 2 and the NMOS active area 3 are connected through a wire and a contact to constitute the inverter logic circuit. Reference numeral 6, which is not yet explained, denotes a grid of the basic cell. The grid is a wire outlet in the layout wiring on a gate array. In the first embodiment, there are three grids in the X direction (widthwise direction or the lateral direction in the drawing), and ten grids in the Y direction (lengthwise direction or vertical direction in the drawing). In this embodiment, the example having 3×10 grids will be explained; however, the present invention is not limited thereto.

In the first embodiment, an inverter function will be taken as an example to explain the operation thereof.

If the signal supplied to the first gate 11 is switched from "L" to "H," then the PMOS transistor P1 turns OFF, while the NMOS transistor N1 turns ON. At this time, current flows into the GND wire 5 from an "H" potential at the drain end through the first gate 11 on the NMOS transistor N1, causing the potential at the drain end to switch from "H" to "L." The PMOS transistor P2 and the NMOS transistor N2 are not connected, so that floating takes place, and the gate 12 does not operate even if a signal is applied thereto.

Meanwhile, if the signal supplied to the first and second gates 11 and 12 is switched from "H" to "L," then the PMOS transistor P1 turns ON, while the NMOS transistor N1 turns OFF. The P2 and N2 are in a floating state and do not operate. At this time, current flows to the drain end from the power source wire 4 through the first bent portions 11b and 12b on the PMOS transistors P1 and P2, causing the potential at the drain end to change over from "L" to "H."

Thus, according to the embodiment, even when the first and second gates 11 and 12 having the bent portions 11b, 11d, and 12b and 12d are used, the same logic as that of a conventional straight gate type gate array semiconductor device having straight gates can be obtained.

Figure 2A:
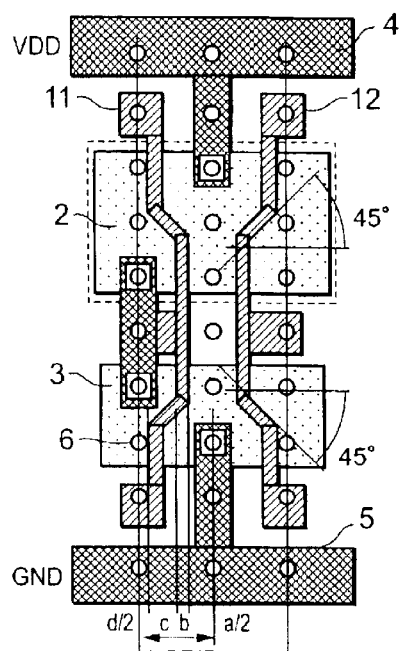
FIGS. 2(a) and 2(b) provide explanatory drawings illustrating the integration in an X direction, FIG. 2(a) illustrating the case of the basic cell shown in FIG. 1, while 2(b) illustrating the case of a conventional basic cell.
Figure 2B:
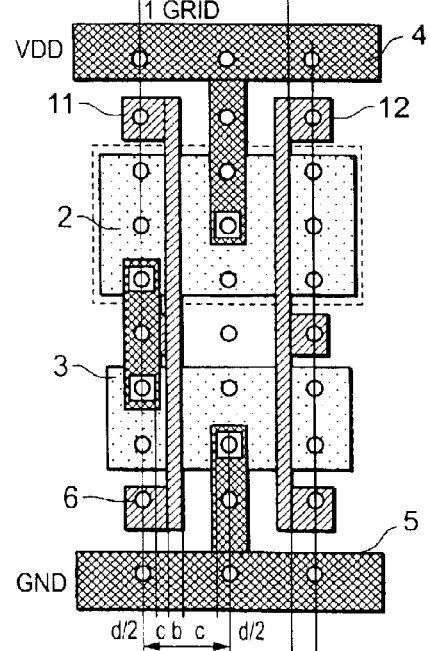

Furthermore, integration in the X direction can be achieved, as shown in FIGS. 2(a) and 2(b). More specifically, according to a design rule, the smallest grid in the X direction will be as follows:

(a) 1 grid=a/2+b+c+d/2 when the gate according to the embodiment is used, while (b) 1 grid=b+2×c+d in a conventional example, where a: Gate-to-gate interval
 b: Gate length
 c: Gate-to-contact interval
 d: contact diameter.

The difference between (a) and (b) will be "(b) 1 grid in the conventional example"−"(a) 1 grid in the first embodiment"=(b+2c+d)−(a/2+b+c+d/2)=c+d/2−a/2.

Normally, a: gate-to-gate interval≈c: gate-to-contact interval, meaning a reduction of c/2+d/2.

Figures 3A, 3B:
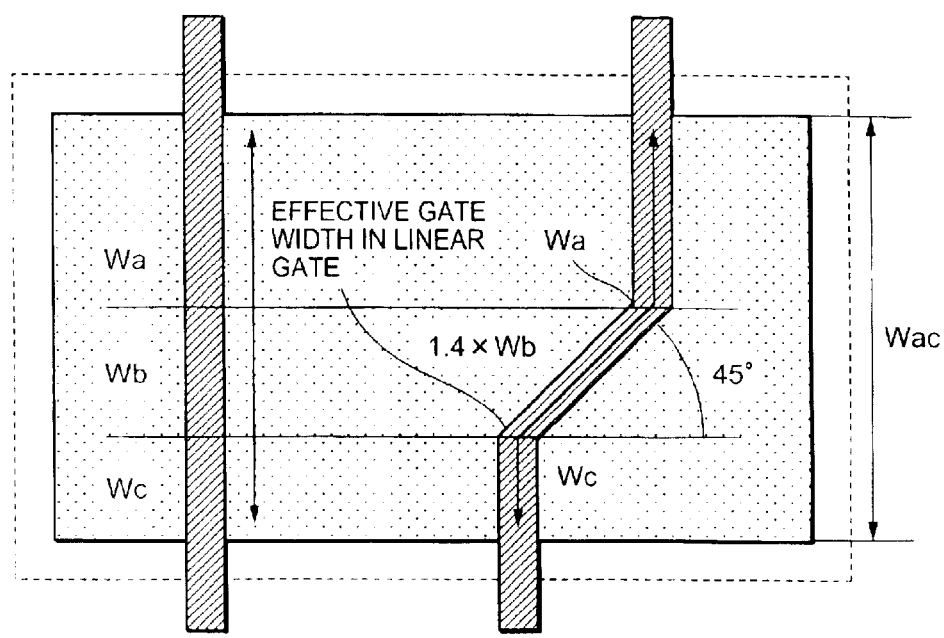
FIGS. 3(a) and 3(b) provide explanatory drawings illustrating the integration in an Y direction, FIG. 3(a) illustrating the case of the conventional basic cell, while 3(b) illustrating the case of the basic cell shown in FIG. 1.

Also in the Y direction, with respect to a gate width for obtaining a required driving force, a longitudinal length equivalent to the gate width is required in the conventional example. As shown in FIGS. 3(a) and 3(b), the use of the gate having the bent portions increases the gate width of the bent portions by √2 times (about 1.4 times), as compared with the linear portions. Hence, the active area in the Y direction required to obtain the same gate width can be decreased. The example shown in FIG. 3(a) illustrates the conventional linear gate length W=Wa+Wb+Wc=Wac in comparison with FIG. 3(b) which illustrates the length of the gate having the bent portion according to the embodiment W=Wa+1.4×Wb+Wc>Wac. In other words, if the active area in the Y direction remains unchanged, then a larger driving force than in the conventional example can be obtained.

The compression of the grid in the X and Y directions allows an increased number of mountable gates in a gate array, so that a still higher level of integration can be achieved, as compared with the improvement achieved merely by the optimized wiring layout. According to the knowledge of the inventors, the integration has been increased by about 1.7 times, as compared with the case where linear gates are used. Furthermore, the delay time is below 1% in the case of a discrete basic cell, or about 5% even when a larger load is applied to the basic cell, which are negligible. The required area has been reduced by about 12%.

(Second Embodiment)

Figure 4:
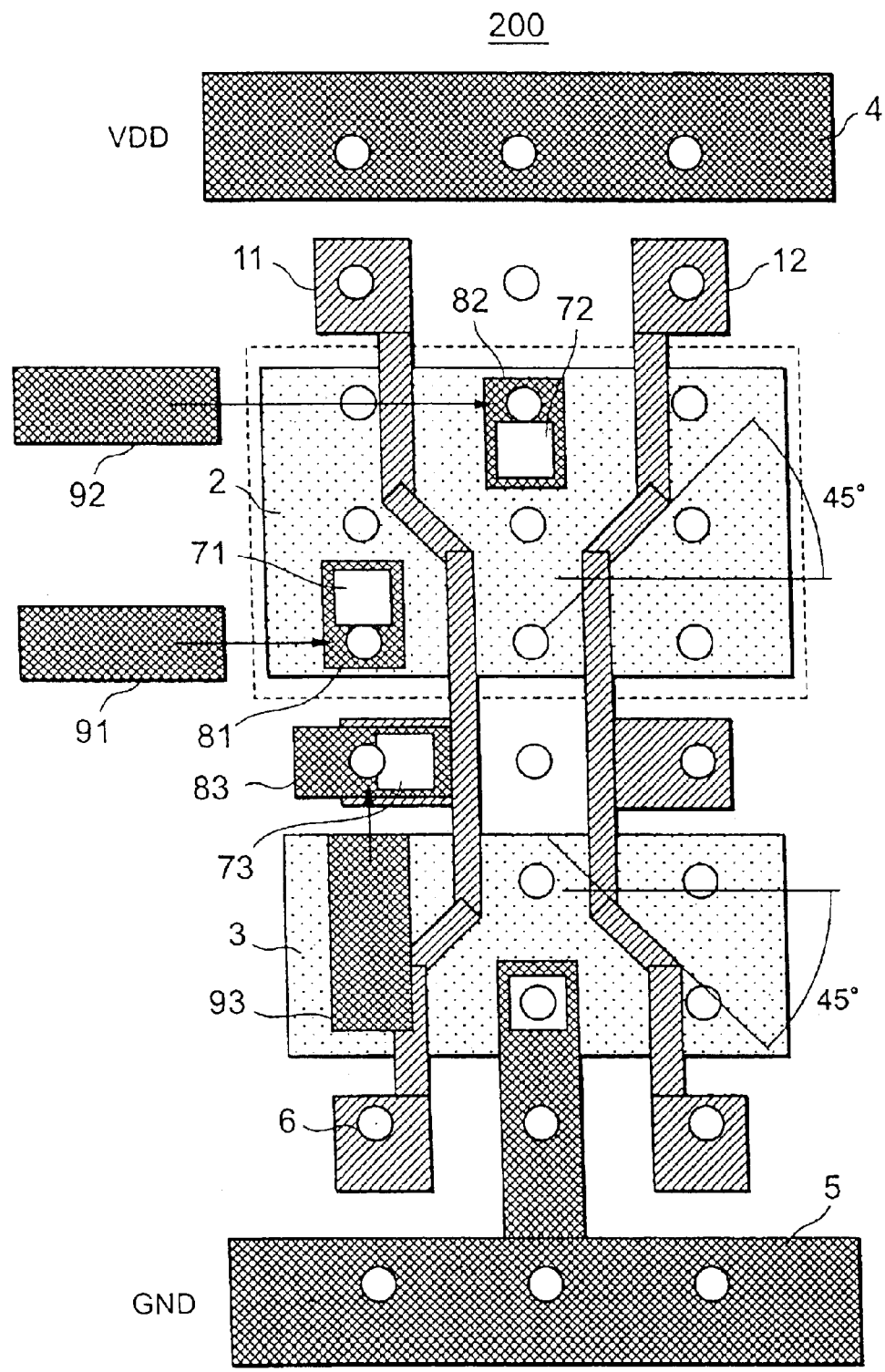
FIG. 4 is an explanatory drawing of a basic cell according to a second embodiment.

FIG. 4 is an explanatory drawing showing a basic cell of a gate array semiconductor device according to the second embodiment. Unlike the basic cell 100 in the first embodiment, as shown in FIG. 1, a basic cell 200 has contacts 71 through 73, which are disposed on PMOS transistors P1 and P2 and NMOS transistors N1 and N2 such that they are away from grids 6. The contacts 71 through 73 are connected to first wires 81 through 83. The first wires 81 through 83 are laid out so as not to violate design rules specifying the connection width when contact is involved, the interval between adjoining wires, etc. when laying wires on the grids 6.

As shown in FIG. 4, the first wires 81 through 83 and second wires 91 through 93 from outside are all disposed on the grids 6. In this embodiment, the connection to the first wires 81 through 83 and the second wires 91 through 93 is made as described below. The second wire 91 from the X direction is connected to the outgoing first wire 81 via a first through hole, and further connected from the outgoing first wire 81 to the PMOS transistors P1 and P2 via the contact 71. The second wire 92 from the X direction is connected to the outgoing first wire 82 and further connected from the outgoing first wire 82 to the PMOS transistors P1 and P2 via the contact 72. Furthermore, the second wire 93 from the Y direction, for example, is connected to the outgoing first wire 83, and further connected from the outgoing first wire 83 to a gate 11 via the contact 73.

Figure 5A:
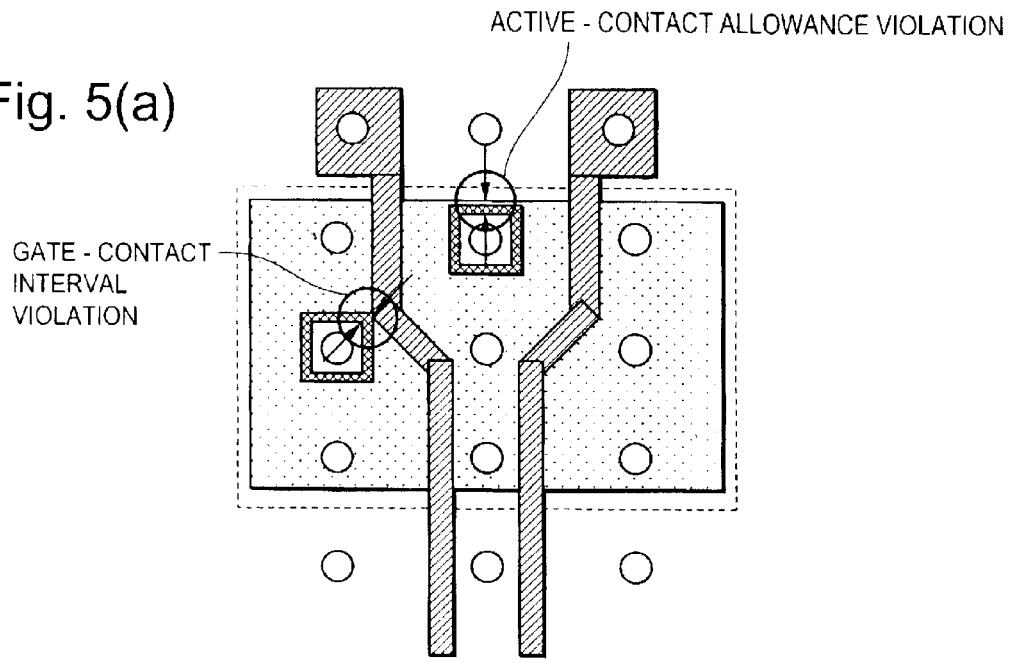
FIGS. 5(a) and 5(b) are explanatory drawings showing an exemplary disposition of a contact, FIG. 5(a) illustrating the contact disposed on a grid, while FIG. 5(b) illustrating the contact disposed outside the grid.
Figure 5B:
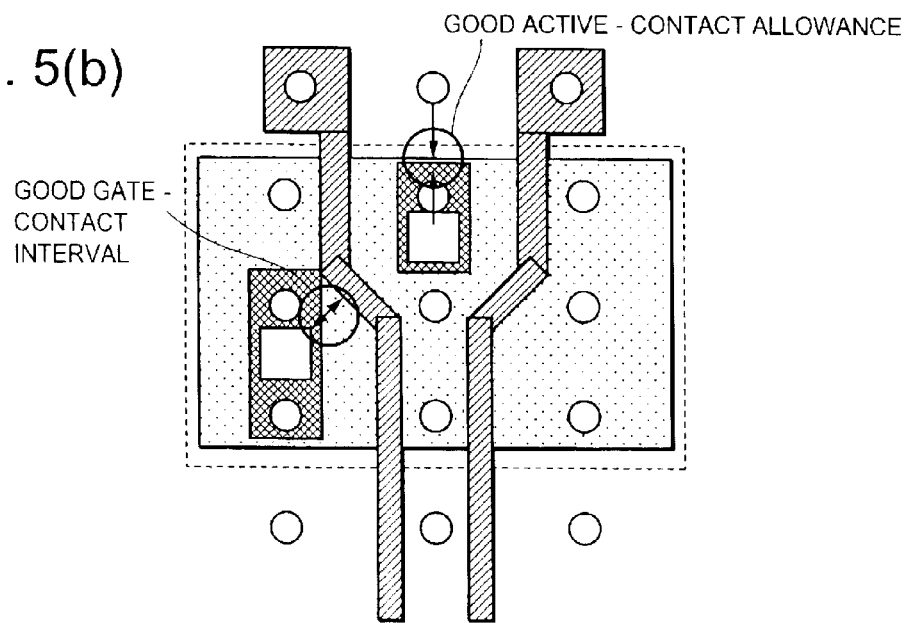

FIGS. 5(a) and 5(b) are explanatory drawings of the second embodiment. Conventionally, the contacts disposed on the PMOS transistors P1 and P2 and the NMOS transistors N1 and N2 have been disposed on the grids 6, as shown in FIG. 5(a). In this case, it has been possible to form outgoing wires on the contacts in a minimum area, and to easily connect them with external components. However, the design rules are violated if the contacts are disposed on the grids 6 when the gates with the bent portions are used, as in the first embodiment, or when the area of a basic cell is reduced to improve integration.

Thus, in FIG. 5(a) illustrates the violation of the allowance between a contact and active edge, or the violation of the interval between a gate and a contact for the gate having a bent portion. In this respect, applying the embodiment permits the layout free of design rule violation even in the basic cell layout with a reduced area, as shown in FIG. 5(b). This arrangement permits a layout that does not cause design rule violation even in the basic cell layout with a reduced area shown in FIG. 5(b), providing an advantage in that integration is further improved by a reduction in area.

The outgoing wires from the contacts should cause no problem as long as they are laid so as not to cause a layout standard violation when the wires are drawn onto the grids 6. When the outgoing wires are disposed on the grids, the connection from outside remains the same as that in the conventional design, so that an additional advantage can be obtained in that the application to a conventional layout system is easier.

(Third Embodiment)

Figure 6:
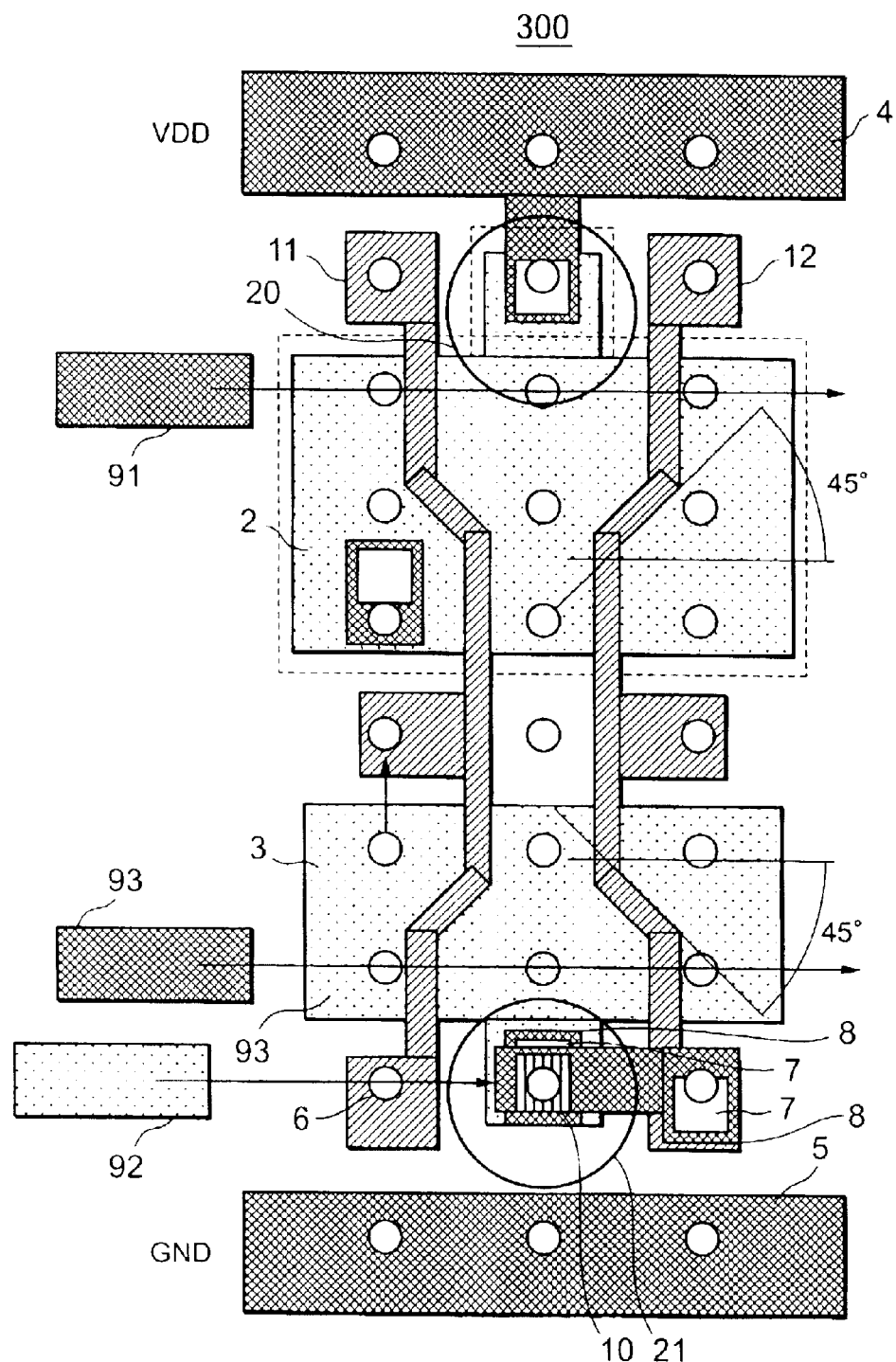
FIG. 6 is an explanatory drawing of a basic cell according to a third embodiment.

FIG. 6 is an explanatory drawing that shows a basic cell of a gate array semiconductor device according to a third embodiment. Unlike the basic cell 100 shown in FIG. 1 or the basic cell 200 shown in FIG. 4, a basic cell 300 shown in FIG. 6 has a protuberant portion 20 that projects from a PMOS active area 2, and is designed to include the area between first and second gates 11 and 12 and a grid 6. Similarly, a protuberant portion 21 projecting from an NMOS active area 3 is designed to include the area between first and second gates 11 and 12 and a grid 6.

Referring to FIG. 6, laying out the protuberant portions 20 and 21 that include the grids 6 leads to a higher degree of wiring freedom. For instance, a power source wire is connected to the protuberant portion 20 on the PMOS transistors P1 and P2 to provide a potential to the first and second gates 11 and 12 as a source.

Similarly to the protuberant portion 20, the protuberant portion 21 can be connected to a GND wire. To connect the second wire 92 to the gate and the drain from an external line, it is once connected to the first wire at the protuberant portion 21 via the first through hole 10 at the grid of the protuberant portion, and the first wire is connected to the second gate 12 via a contact 7 from an outgoing wire 8 of the first wire. This applies also to the first gate 11. Similarly, in the protuberant portion 21, the connection is made from the outgoing wire 8 to the drain regions of the NMOS transistors N1 and N2 via the contact 7. This applies also to the protuberant portions 20 of the p-channel transistors P1 and P2.

Thus, disposing the protuberant portions 20 and 21 between the first and second gates 11 and 12 provides an advantage in that the numbers of the outgoing wires from a power source and the grids used for the connection to share a gate and a drain can be reduced. In particular, when a gate with the bent portions is used, the protuberant portions provide extremely effective means in the wiring in a basic cell to make up for the availability of grids sacrificed to achieve higher integration because of the design rules on the bent portions. With this arrangement, a higher level of integration can be achieved.

Furthermore, as shown in FIG. 6, there is a case where no grid in the X direction is used when the protuberant portions and the outgoing wires are used, so that the connecting wires 91 and 93 using the first wires from outside can be directly connected. This means an increase in the area for wiring, providing an advantage in that the number of gates that can be effectively used to improve integration can be increased.

(Fourth Embodiment)

Figure 7:
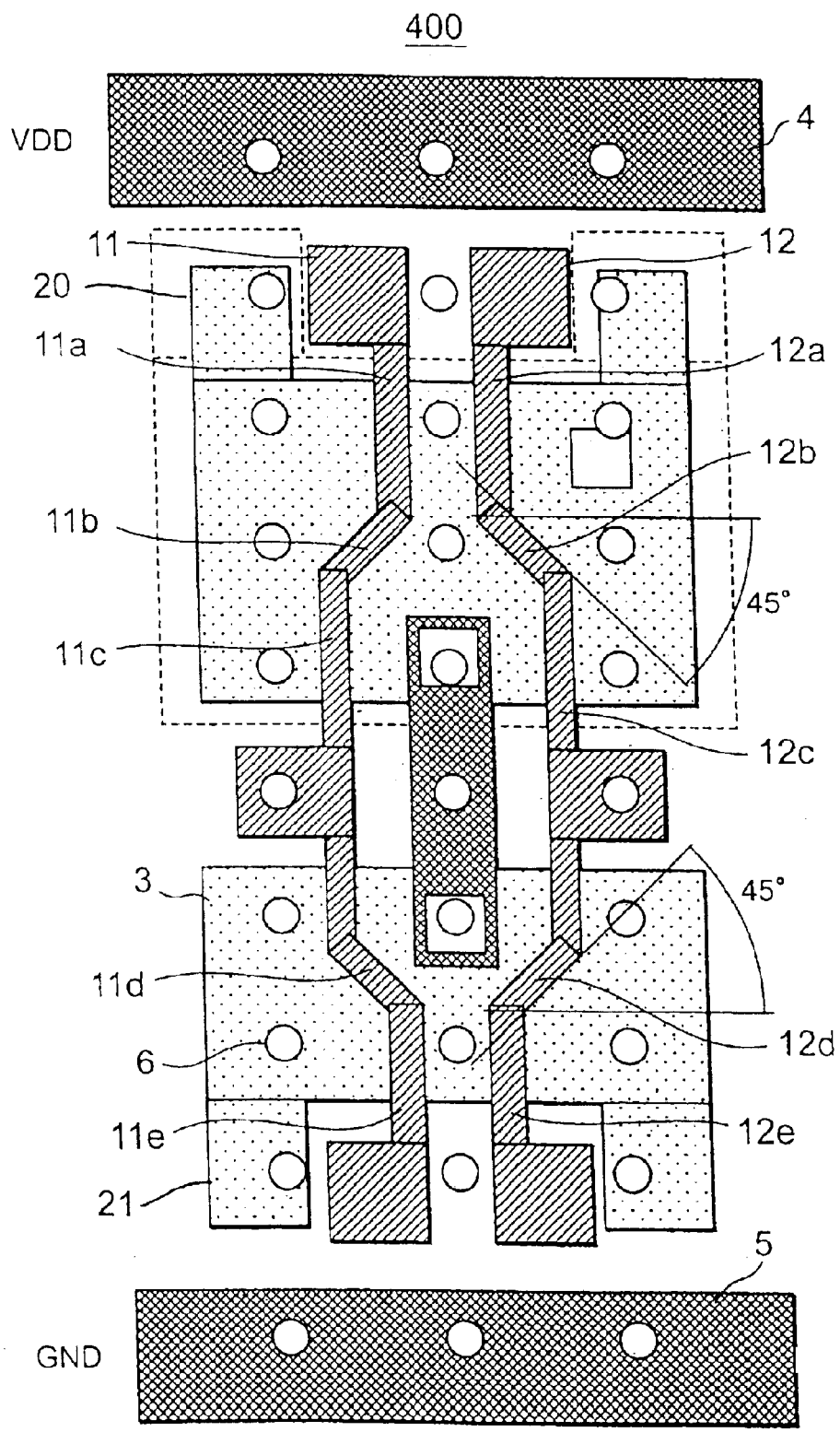
FIG. 7 is an explanatory drawing of a basic cell according to a fourth embodiment.

FIG. 7 is a layout diagram showing a basic cell of a gate array according to a fourth embodiment. As compared with the basic cell 100 shown in FIG. 1, in a basic cell 400, the bent portions of the first and second gates 11 and 12 are laid out and disposed on transistors such that they are laterally inverted.

More specifically, according to the embodiment, the first gate 11 is formed of a first linear portion 11a, a first bent portion 11b that is bent away from the second gate 12 at about 45 degrees, a second linear portion 11c, a second bent portion 11d that is bent toward the second gate 12 at about 45 degrees, and a third linear portion 11e located in this order from the top. The second gate 12 is formed of a first linear portion 12a, a first bent portion 12b that is bent away from the first gate 11 at about 45 degrees, a second linear portion 12c, a second bent portion 12d that is bent toward the first gate 11 at about 45 degrees, and a third linear portion 12e located in this order from the top.

Protuberant portions 20 and 21 are located at right and left edges so as not to be overlapped with the areas of the first and second gates 11 and 12, while they are located at the center in the third embodiment.

As compared with the first through third embodiments, this embodiment shares the same construction except that the bent portions are inversely disposed and the protuberant portions are disposed at different positions. In comparison with the first through third embodiments, according to this embodiment, two protuberant portions can be formed in each of the PMOS transistor and the NMOS transistor, and the connection with the drain regions of the PMOS and the NMOS requires minimized wiring from the central wire.

Thus, according to the embodiment, more space can be secured for the protuberant portions 20 and 21 by changing the orientation of the bent portions of the gate, so that the number of grids to be used and the number of wires to be used can be minimized in a cell having numerous power source/GND connections, and the wiring efficiency can be improved. This advantageously leads to a higher level of integration and an increased number of effectively used gates.

Figure 8A:
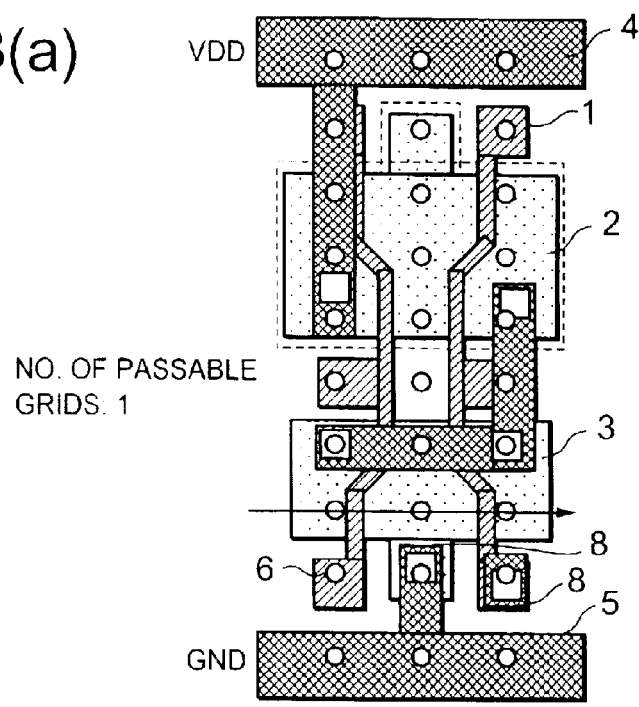
FIGS. 8(a) and 8(b) are explanatory drawings of a NOR layout, FIG. 8(a) illustrating the case where a basic cell according to the third embodiment is used, while FIG. 8(b) illustrating the case where a basic cell according to the fourth embodiment is used.
Figure 8B:
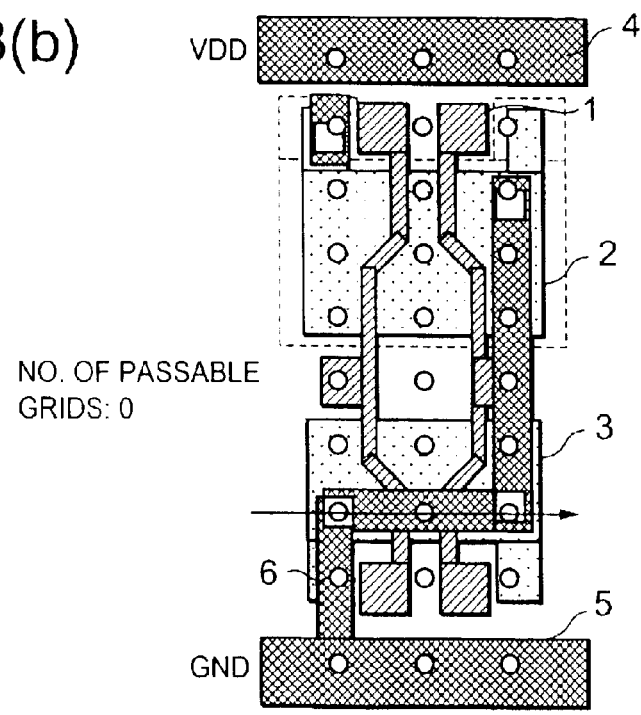

FIGS. 8(a) and 8(b) provide explanatory drawings of the layout of a NOR gate according to the third embodiment, and the layout of a NOR gate according to the fourth embodiment. The NOR gate having the layout according to the third embodiment has one passable grid from outside, while the NOR gate having the layout according to the fourth embodiment has no passable grid from outside. This means that the fourth embodiment is not suited for the construction of the fourth embodiment, while the third embodiment provides a marked advantage.

Figure 9A:
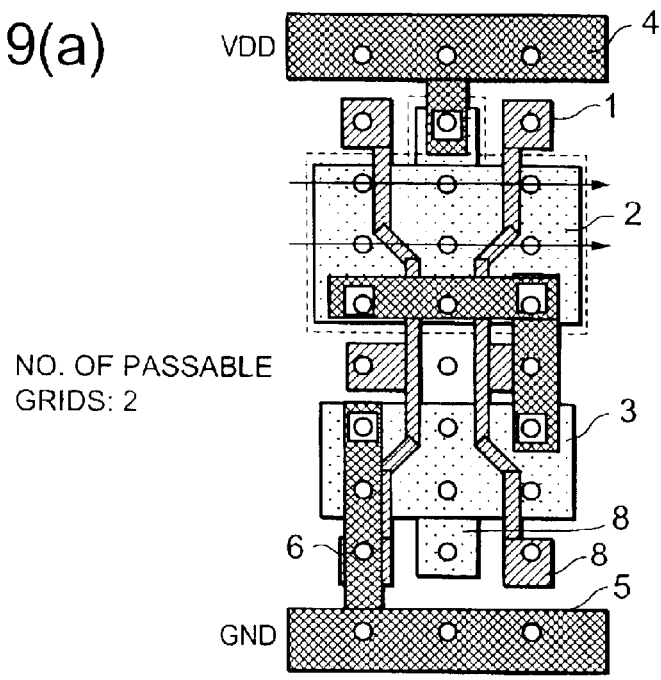
FIGS. 9(a) and 9(b) are explanatory drawings of a NAND layout, FIG. 9(a) illustrating the case where the basic cell according to the third embodiment is used, while FIG. 9(b) illustrating the case where the basic cell according to the fourth embodiment is used.
Figure 9B:
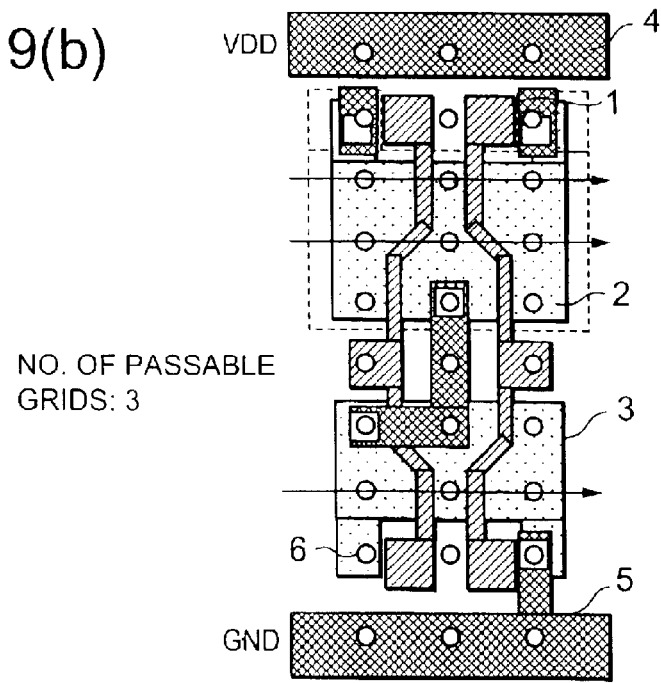

FIGS. 9(a) and 9(b) provide explanatory drawings of the layout of a NAND gate according to the third embodiment, and the layout of a NAND gate according to the fourth embodiment. The NAND gate according to the third embodiment has two passable grids, while the NAND gate according to the fourth embodiment has three passable grids. In addition, the number of passages of an NMOS transistor can be obtained. Hence, for a chip layout using numerous NANDs, the fourth embodiment rather than the third embodiment permits better layout wiring efficiency and an increased number of gates used, resulting in improved integration.

(Fifth Embodiment)

Figure 10:
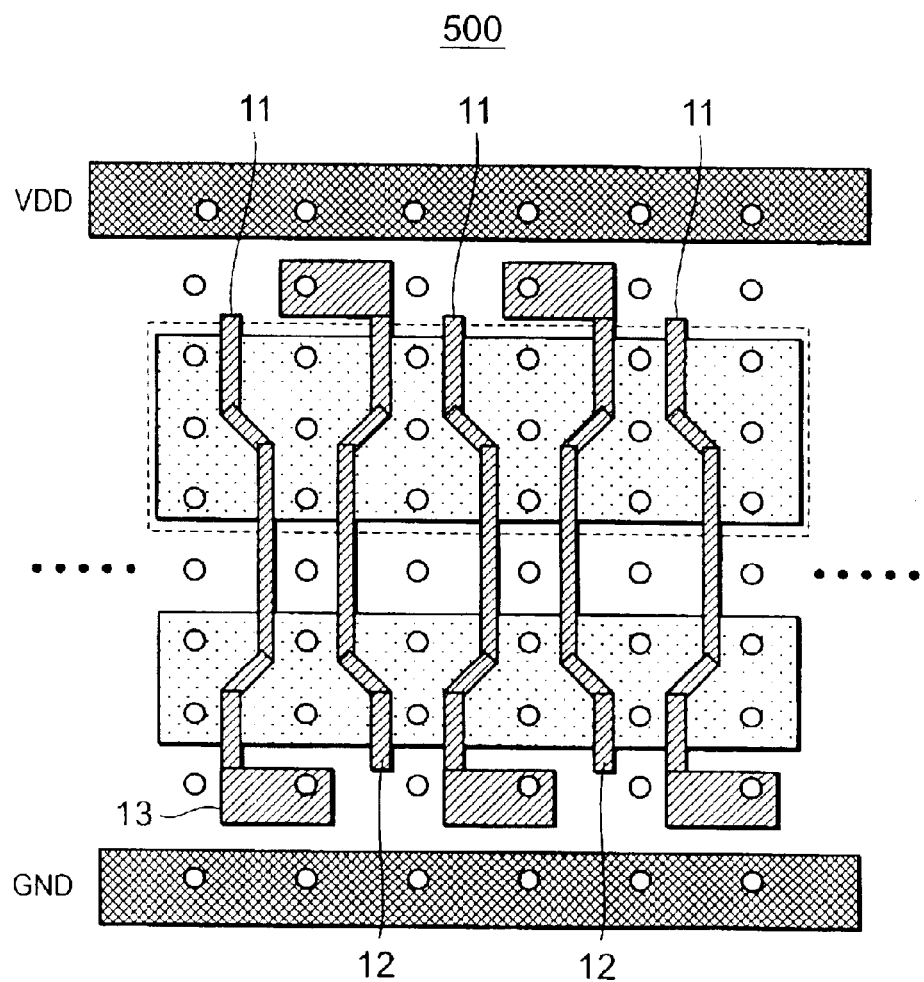
FIG. 10 is an explanatory drawing of a gate array semiconductor device according to a fifth embodiment.

FIG. 10 is a layout diagram showing a gate array semiconductor device according to a fifth embodiment. In a semiconductor device 500 according to this embodiment, the basic cells including the gates with the bent portions shown in the first through fourth embodiments are disposed in succession, and regions where the contacts for gates and first wires are disposed (contact installing regions) 13 are provided at top ends and bottom ends alternately. In the example shown in FIG. 10, the contact installing regions 13 are respectively provided at the bottom ends of first gates 11 and at the top ends of second gates 12. The present invention, however, is not limited to the above; the contact installing regions 13 may alternatively be provided at the top ends of the first gates 11 and at the bottom ends of the second gates 12.

Figure 11:
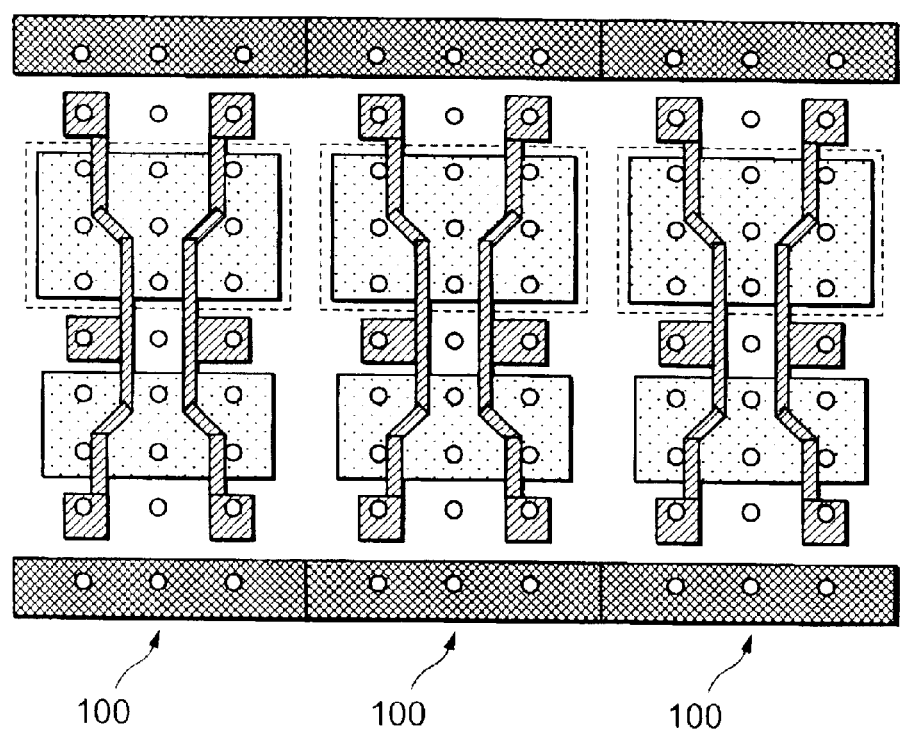
FIG. 11 is an explanatory drawing showing the integration of the semiconductor device of FIG. 10 in the X direction.

FIG. 11 shows a gate array semiconductor device constructed of the basic cells 100 according to the first embodiment, the contact grounding regions being provided at the top and bottom ends of gates. In comparison with this, the embodiment shown in FIG. 10 has no gap between adjacent basic cells, permitting integration in the X direction to be achieved accordingly.

(Sixth Embodiment)

Figure 12:
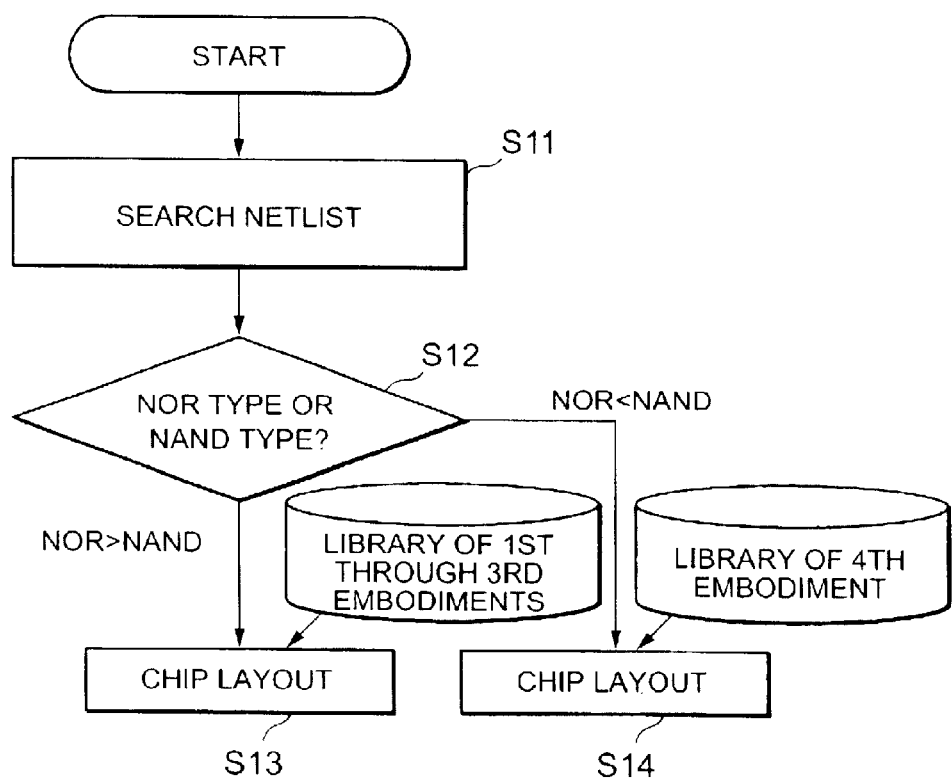
FIG. 12 is an explanatory drawing of a layout method according to a sixth embodiment.
Figure 13:
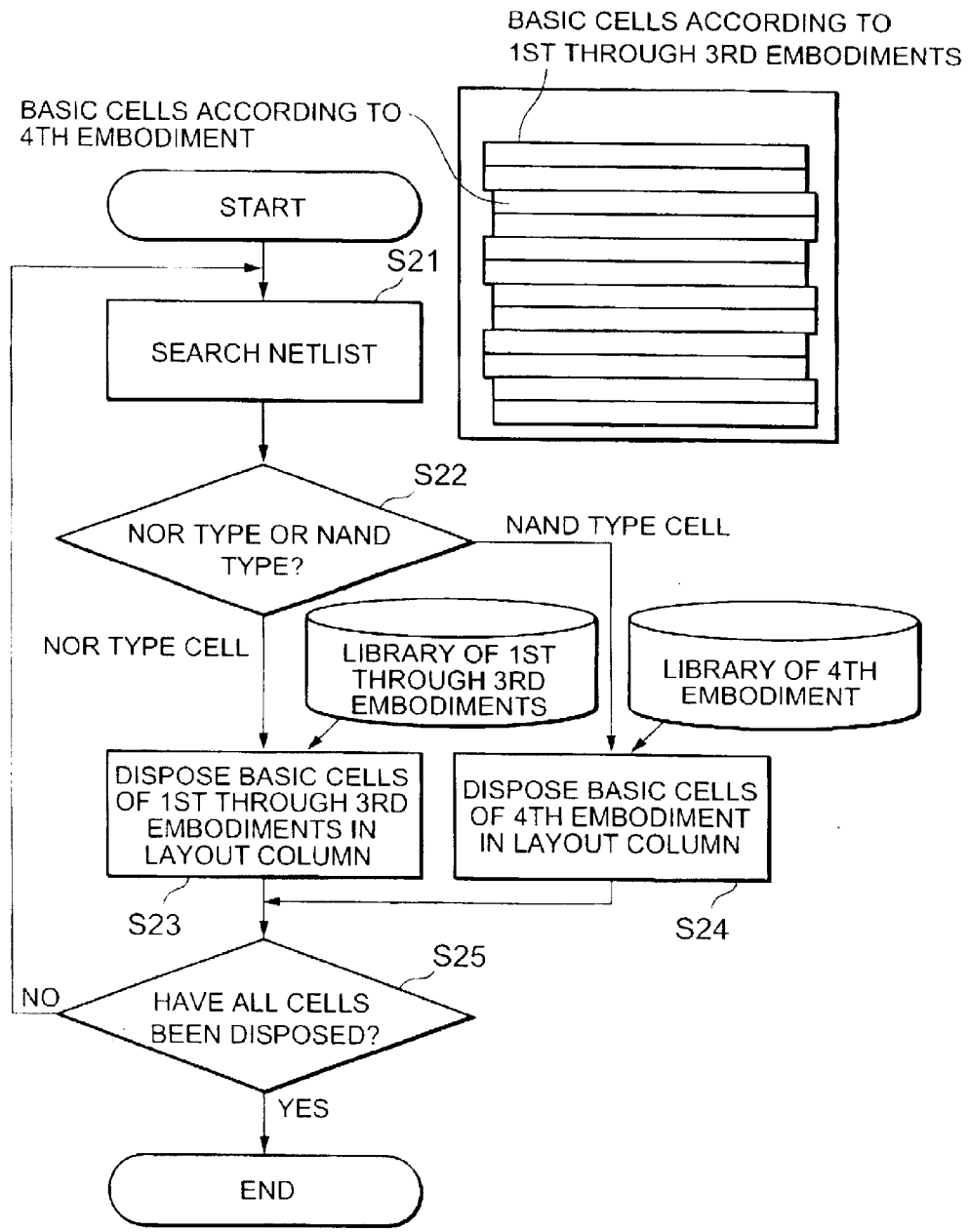
FIG. 13 is another explanatory drawing of the layout method according to the sixth embodiment.

FIG. 12 and FIG. 13 are flowcharts for a sixth embodiment. The sixth embodiment is a computer aided design (CAD) system for laying out basic cells according to the aforesaid embodiments by selecting from among the basic cells according to the first through third embodiments and the fourth embodiment, because NOR type and NAND type have different wiring efficiencies.

Regarding the basic cells according to the first through third embodiments and the fourth embodiment, the layouts of cells to be used are prepared beforehand in the form of a library. In the case shown in FIG. 12, which cell type is dominant is determined by searching a netlist in step S11, then the basic cells of one of the embodiments to be used for making up a gate array are determined in step S12. In step S13 and step S14, chip layout is carried out.

The case shown in FIG. 13 and the case shown in FIG. 12 are similar; however, the basic cells of one of the two groups of the embodiments are disposed in the case shown in FIG. 12, whereas the basic cells of both groups of the embodiments are mixed and laid out in the case shown in FIG. 13. In step S21, it is determined which type of cells is used in a greater number by searching the netlist. In step S22, the basic cells of particular groups of embodiments are selected to constitute a gate array in step S22. Chip layout is carried out in step S23 and step S24. In step S25, it is determined whether all basic cells have been disposed, and the procedure is terminated upon the completion of the disposition.

The CAD system according to this embodiment permits higher layout wiring of the basic cells that provide higher integration. Proper basic cells are selected on the basis of the information regarding existing NAND cells and the information regarding NOR so as to quickly accomplish a chip layout with higher integration and a greater number of gates installed in a smaller area. This permits reduced cost to be achieved.

The descriptions have been given of the preferred embodiments of the basic cells of a gate array semiconductor device, gate array semiconductor devices, and the layout method for a gate array semiconductor device with reference to the accompanying drawings. The present invention, however, is not limited to the embodiments. Various changes and modifications can be made within the technological spirit and scope of the present invention described in the appended claims will become apparent to persons skilled in the art, and are deemed to be automatically embraced in the technological scope of the present invention.

Figure 14:
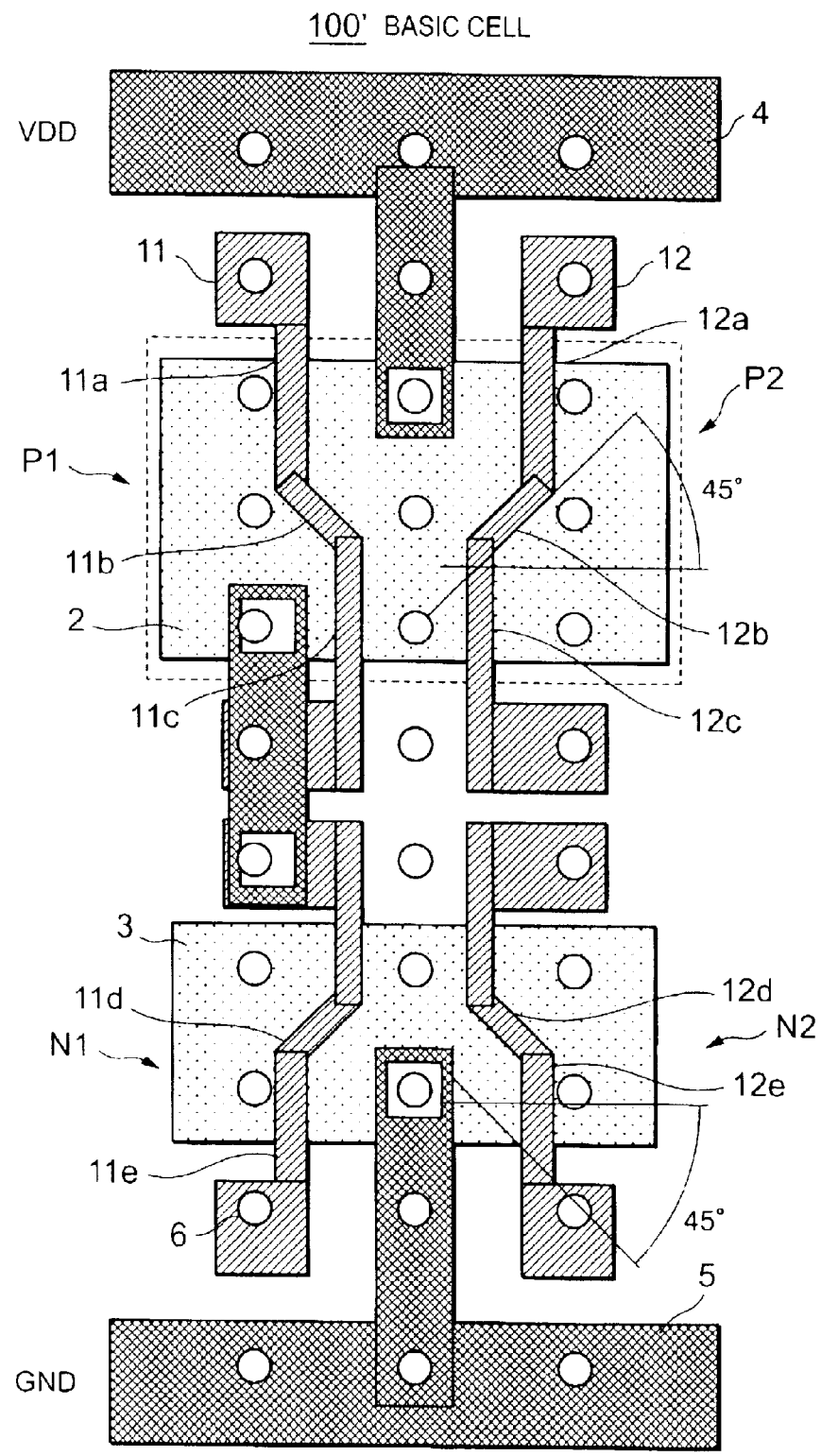
FIG. 14 is an explanatory drawing showing an exemplary application of the basic cell according to the first embodiment.

In the first embodiment explained with reference to FIG. 1, for example, the PMOS transistor P1 and the NMOS transistor N1 share the first gate 11, while the PMOS transistor P2 and the NMOS transistor N2 share the second gate 12; the present invention, however, is not limited thereto. Alternatively, for example, as in the case of a basic cell 100' shown in FIG. 14, a PMOS transistor P1 and an NMOS transistor N1 may be disposed such that a first gate 11 is divided, and a PMOS transistor P2 and an NMOS transistor N2 may be disposed such that a second gate 12 is divided.

What is claimed is:

1. A basic cell of a gate array semiconductor device comprising:
   first and second p-channel MOS transistors and first and second n-channel MOS transistors, wherein
   the first p-channel MOS transistor and the first n-channel MOS transistor are disposed so as to share or divide a first gate,
   the second p-channel MOS transistor and the second n-channel MOS transistor are disposed to share or divide a second gate,
   the first gate has a first linear portion, a first bent portion that is bent toward the second gate at about 45 degrees with respect to a lengthwise direction, a second linear portion, a second bent portion that is bent away from the second gate at about 45 degrees with respect to the lengthwise direction, and a third linear portion located sequentially in order, and
   the second gate has a first linear portion, a first bent portion that is bent toward the first gate at about 45 degrees with respect to the lengthwise direction, a second linear portion, a second bent portion that is bent away from the first gate at about 45 degrees with respect to the lengthwise direction, and a third linear portion located sequentially in order.

2. The basic cell of a gate array semiconductor device according to claim 1, wherein contacts for the first and second gates, the first and second p-channel MOS transistors, and some contacts for the first and second n-channel MOS transistors are disposed away from grids of the first and second p-channel MOS transistors and the first and second n-channel MOS transistors, and metal outgoing wires connected to the contacts are disposed on the grids.

3. The basic cell of a gate array semiconductor device according to claim 2, wherein protuberant portions of the first and second p-channel MOS transistors and protuberant portions of the first and second n-channel MOS transistors are provided between the first and second gates or outside the first and second gates, respectively.

4. A gate array semiconductor device comprising:

at least one or more basic cells according to claim 3 that are disposed in succession; and contact installing regions provided at top ends of the first gates and at bottom ends of the second gates.

5. A layout method for a gate array semiconductor device, wherein a library of layouts of at least two or more basic cells comprising the basic cell according to claim 3 is prepared beforehand, and optimum ones among the basic cells are selected from the library according to construction of a desired gate array semiconductor device, and the selected basic cells are laid out.

6. A gate array semiconductor device comprising:

at least one or more basic cells according to claim 2 that are disposed in succession; and contact installing regions provided at top ends of the first gates and at bottom ends of the second gates.

7. A layout method for a gate array semiconductor device, wherein a library of layouts of at least two or more basic cells comprising the basic cell according to claim 2 is prepared beforehand, and optimum ones among the basic cells are selected from the library according to construction of a desired gate array semiconductor device, and the selected basic cells are laid out.

8. The basic cell of a gate array semiconductor device according to claim 1, wherein protuberant portions of the first and second p-channel MOS transistors and protuberant portions of the first and second n-channel MOS transistors are provided between the first and second gates or outside the first and second gates, respectively.

9. A gate array semiconductor device comprising:

at least one or more basic cells according to claim 8 that are disposed in succession; and contact installing regions provided at top ends of the first gates and at bottom ends of the second gates.

10. A layout method for a gate array semiconductor device, wherein a library of layouts of at least two or more basic cells comprising the basic cell according to claim 8 is prepared beforehand, and optimum ones among the basic cells are selected from the library according to construction of a desired gate array semiconductor device, and the selected basic cells are laid out.

11. A gate array semiconductor device comprising:

at least one or more basic cells according to claim 1 that are disposed in succession; and contact installing regions provided at top ends of the first gates and at bottom ends of the second gates.

12. A layout method for a gate array semiconductor device, wherein a library of layouts of at least two or more basic cells comprising the basic cell according to claim 1 is prepared beforehand, and optimum ones among the basic cells are selected from the library according to construction of a desired gate array semiconductor device, and the selected basic cells are laid out.

13. A basic cell of a gate array semiconductor device comprising:

first and second p-channel MOS transistors and first and second n-channel MOS transistors, wherein the first p-channel MOS transistor and the first n-channel MOS transistor are disposed so as to share or divide a first gate, the second p-channel MOS transistor and the second n-channel MOS transistor are disposed to share or divide a second gate, the first gate has a first linear portion, a first bent portion that is bent away from the second gate at about 45 degrees with respect to a lengthwise direction, a second linear portion, a second bent portion that is bent toward the second gate at about 45 degrees with respect to the lengthwise direction, and a third linear portion located sequentially in order, and the second gate has a first linear portion, a first bent portion that is bent away from the first gate at about 45 degrees with respect to the lengthwise direction, a second linear portion, a second bent portion that is bent toward the first gate at about 45 degrees with respect to the lengthwise direction, and a third linear portion located sequentially in order.

14. The basic cell of a gate array semiconductor device according to claim 13, wherein contacts on the first and second gates, the first and second p-channel MOS transistors, and some contacts for the first and second n-channel MOS transistors are disposed away from grids of the first and second p-channel MOS transistors and the first and second n-channel MOS transistors, and metal outgoing wires connected to the contacts are disposed on the grids.

15. The basic cell of a gate array semiconductor device according to claim 14, wherein protuberant portions of the first and second p-channel MOS transistors and protuberant portions of the first and second n-channel MOS transistors are provided between the first and second gates or outside the first and second gates, respectively.

16. A gate array semiconductor device comprising:

at least one or more basic cells according to claim 15 that are disposed in succession; and contact installing regions provided at top ends of the first gates and at bottom ends of the second gates.

17. A layout method for a gate array semiconductor device, wherein a library of layouts of at least two or more basic cells comprising the basic cell according to claim 15 is prepared beforehand, and optimum ones among the basic cells are selected from the library according to construction of a desired gate array semiconductor device, and the selected basic cells are laid out.

18. A gate array semiconductor device comprising:

at least one or more basic cells according to claim 14 that are disposed in succession; and contact installing regions provided at top ends of the first gates and at bottom ends of the second gates.

19. A layout method for a gate array semiconductor device, wherein a library of layouts of at least two or more basic cells comprising the basic cell according to claim 14 is prepared beforehand, and optimum ones among the basic cells are selected from the library according to construction of a desired gate array semiconductor device, and the selected basic cells are laid out.

20. The basic cell of a gate array semiconductor device according to claim 13, wherein protuberant portions of the first and second p-channel MOS transistors and protuberant portions of the first and second n-channel MOS transistors are provided between the first and second gates or outside the first and second gates, respectively.

21. A gate array semiconductor device comprising:

at least one or more basic cells according to claim 20 that are disposed in succession; and contact installing regions provided at top ends of the first gates and at bottom ends of the second gates.

22. A layout method for a gate array semiconductor device, wherein a library of layouts of at least two or more basic cells comprising the basic cell according to claim 20 is prepared beforehand, and optimum ones among the basic cells are selected from the library according to construction of a desired gate array semiconductor device, and the selected basic cells are laid out.

23. A gate array semiconductor device comprising:

at least one or more basic cells according to claim 13 that are disposed in succession; and contact installing regions provided at top ends of the first gates and at bottom ends of the second gates.

24. A layout method for a gate array semiconductor device, wherein a library of layouts of at least two or more basic cells comprising the basic cell according to claim 13 is prepared beforehand, and optimum ones among the basic cells are selected from the library according to construction of a desired gate array semiconductor device, and the selected basic cells are laid out.

25. The basic cell of a gate array semiconductor device comprising:

first and second p-channel MOS transistors and first and second n-channel MOS transistors, wherein the first p-channel MOS transistor and the first n-channel MOS transistor are disposed so as to share or divide a first gate, the second p-channel MOS transistor and the second n-channel MOS transistor are disposed to share or divide a second gate, the first and second gates have portions bent at about 45 degrees with respect to a lengthwise direction, contacts for the first and second gates, the first and second p-channel MOS transistors, and some contacts for the first and second n-channel MOS transistors are disposed away from grids of the first and second p-channel MOS transistors and the first and second n-channel MOS transistors, and metal outgoing wires connected to the contacts are disposed on the grids.

26. The basic cell of a gate array semiconductor device according to claim 25, wherein protuberant portions of the first and second p-channel MOS transistors and protuberant portions of the first and second n-channel MOS transistors are provided between the first and second gates or outside the first and second gates, respectively.

27. A gate array semiconductor device comprising:

at least one or more basic cells according to claim 26 that are disposed in succession; and contact installing regions provided at top ends of the first gates and at bottom ends of the second gates.

28. A layout method for a gate array semiconductor device, wherein a library of layouts of at least two or more basic cells comprising the basic cell according to claim 26 is prepared beforehand, and optimum ones among the basic cells are selected from the library according to construction of a desired gate array semiconductor device, and the selected basic cells are laid out.

29. A gate array semiconductor device comprising:

at least one or more basic cells according to claim 25 that are disposed in succession; and contact installing regions provided at top ends of the first gates and at bottom ends of the second gates.

30. A layout method for a gate array semiconductor device, wherein a library of layouts of at least two or more basic cells comprising the basic cell according to claim 25 is prepared beforehand, and optimum ones among the basic cells are selected from the library according to construction of a desired gate array semiconductor device, and the selected basic cells are laid out.

* * * * *